United States Patent
Epple et al.

(10) Patent No.: US 6,717,746 B2
(45) Date of Patent: Apr. 6, 2004

(54) CATADIOPTRIC REDUCTION LENS

(75) Inventors: Alexander Epple, Aalen (DE); Helmut Beierl, Heidenheim (DE)

(73) Assignee: Carl Zeiss Semiconductor Manufacturing Technologies AG, Oberkochen (DE)

(*) Notice: Subject to any disclaimer, the term of this patent is extended or adjusted under 35 U.S.C. 154(b) by 0 days.

(21) Appl. No.: 10/152,290

(22) Filed: May 22, 2002

(65) Prior Publication Data

US 2003/0021040 A1 Jan. 30, 2003

(30) Foreign Application Priority Data

May 22, 2001 (DE) .......................................... 101 27 227

(51) Int. Cl.[7] .............................................. G02B 17/08
(52) U.S. Cl. ...................... 359/727; 359/733; 359/364
(58) Field of Search ................... 359/726–736, 359/649–651, 364–366

(56) References Cited

U.S. PATENT DOCUMENTS

| | | | |
|---|---|---|---|
| 4,714,307 A | * 12/1987 | Palmer ........................ 359/351 |
| 5,052,763 A | 10/1991 | Singh et al. |
| 5,140,459 A | * 8/1992 | Sagan ........................ 359/434 |
| 5,592,329 A | 1/1997 | Ishiyama et al. |
| 5,689,377 A | 11/1997 | Takahashi |
| 5,694,241 A | 12/1997 | Ishiyama et al. |
| 5,808,805 A | 9/1998 | Takahashi |
| 5,969,882 A | 10/1999 | Takahashi |
| 5,999,333 A | 12/1999 | Takahashi |
| 6,157,498 A | 12/2000 | Takahashi |
| 6,169,627 B1 | * 1/2001 | Schuster ..................... 359/364 |
| 6,424,471 B1 | * 7/2002 | Ulrich et al. ................ 359/732 |
| 2001/0022691 A1 | 9/2001 | Furter et al. |
| 2003/0025894 A1 | * 2/2003 | Owa et al. .................... 355/67 |
| 2003/0039028 A1 | * 2/2003 | Oskotsky et al. ........... 359/366 |

FOREIGN PATENT DOCUMENTS

| | | |
|---|---|---|
| DE | 197 26 058 A1 | 1/1998 |
| EP | 0 736 789 A2 | 10/1996 |
| EP | 0 833 180 A2 | 4/1998 |
| EP | 0 887 708 A2 | 12/1998 |
| EP | 0 989 434 A2 | 3/2000 |
| EP | 1 122 608 A2 | 8/2001 |
| JP | 10010429 A | 1/1998 |
| WO | WO 03/027747 A1 | 4/2003 |

* cited by examiner

Primary Examiner—Scott J. Sugarman
Assistant Examiner—Deborah A. Raizen
(74) Attorney, Agent, or Firm—Sughrue Mion, PLLC

(57) ABSTRACT

A catadioptric projection lens configured for imaging a pattern arranged in an object plane (2) onto an image plane (4) while creating a single, real, intermediate image (3) has a catadioptric first section (5) having a concave mirror (6) and a beam-deflection device (7), and a dioptric second section (8) that commences after the beam-deflection device. The system is configured such that the intermediate image follows the first lens (17) of the dioptric section (8) and is preferably readily accessible. Arranging the intermediate image both between a pair of lenses (17, 21) of the dioptric section and at a large distance behind the final reflective surface of the beam-deflection device helps to avoid imaging aberrations.

24 Claims, 5 Drawing Sheets

CATADIOPTRIC REDUCTION LENS

The following disclosure is based on German Patent Application No. 10127227.8 filed on May 22, 2001, which is incorporated into this application by reference.

BACKGROUND OF THE INVENTION

1. Field of Invention

The invention relates to a catadioptric projection lens for imaging a pattern arranged in an object plane onto an image plane.

2. Description of the Related Art

Projection lenses of said type are employed on projection illumination systems, in particular wafer scanners or wafer steppers, used for fabricating semiconductor devices and other types of micro-devices and serve to project patterns on photomasks or reticles, hereinafter referred to generically as "masks" or "reticles," onto an object having a photosensitive coating with ultrahigh-resolution on a reduced scale.

In order to create even finer structures, it will be necessary to both increase the numerical aperture (NA) of the projection lens to be involved on its image side and to employ shorter wavelengths, preferably ultraviolet light with wavelengths less than about 260 nm.

However, there are very few materials, in particular, synthetic quartz glass and crystalline fluorides, such as calcium fluoride, magnesium fluoride, barium fluoride, lithium fluoride, lithium calcium aluminum fluoride, lithium strontium aluminum fluoride, and similar, that are sufficiently transparent in that wavelength region available for fabricating the optical elements required. Since the Abbé numbers of those materials that are available lie rather close to one another, it is difficult to provide purely refractive systems that have been sufficiently well-corrected for chromatic aberrations. Although this problem could be solved by employing purely reflective systems, fabricating such mirror systems requires substantial expense and effort.

In view of the aforementioned problems, catadioptric systems that combine refracting and reflecting elements, i.e., in particular, lenses and mirrors, are primarily employed for configuring high-resolution projection lenses of the aforementioned type.

Whenever imaging reflective surfaces are employed, it will be necessary to use beam-deflecting devices if images free of obscurations and vignetting are to be achieved. Both systems having one or more deflecting mirrors and systems having solid beam-splitters are known. Additional plane mirrors may also be employed for folding the optical path. Folding mirrors are usually employed only in order to allow meeting space requirements, in particular, in order to orient the object and image planes parallel to one another. However, folding mirrors are not absolutely necessary from the optical-design standpoint.

Employing systems having a solid beamsplitter in the form of, e.g., a beamsplitter cube (BSC), has the advantage that it allows implementing on-axis systems. Polarization-selective reflective surfaces that either reflect or transmit incident radiation, depending upon its predominant polarization direction, are employed in such cases. The disadvantage of employing such systems is that hardly any suitable transparent materials are available in the desired, large volumes. Moreover, fabricating optically active beamsplitter coatings situated within beamsplitter cubes is extremely difficult. Heating effects occurring within beamsplitters may also present problems at high radiant intensities, since inside the beamsplitters an intermediate image is created.

One example of such a system is depicted in European Pat. No. EP-A-0 475 020, which corresponds to U.S. Pat. No. 5,052,763, where the mask involved lies directly on a beamsplitter cube and the intermediate image formed lies within the beam-splitter cube, behind its internal beamsplitting surface. Another example is depicted in U.S. Pat. No. 5,808,805 and the associated application for continuation of same, U.S. Pat. No. 5,999,333, where a multi-element compound-lens group with a positive refractive power lies between the object plane and a beamsplitter cube. The collected light beam is initially deflected toward a concave mirror by the beamsplitter cube and then reflected back to the beamsplitter cube and through its beamsplitting surface toward the aforementioned compound-lens group with a positive refractive power by the concave mirror. The intermediate image lies within the beamsplitter cube, in the immediate vicinity of its beamsplitting surface. However, none of these documents makes any statements regarding heating problems that might arise or how they may be avoided.

European Patent No. EP-A-0 887 708 states measures for avoiding thermally induced imaging errors for a catadioptric system having a beamsplitter cube, but apparently no intermediate image falling within its beamsplitter cube. The intention here was obtaining a symmetric distribution of radiant intensity over the beam-splitter cube's beamsplitting surface, i.e., a distribution that would yield a heating profile symmetrically distributed over the beam-splitter's beamsplitting surface, by suitably routing the beam transiting the beamsplitter cube. It was stated that the resultant wave-front distortions, such as those that result from nonuniform heating, which are difficult to eliminate, were avoidable.

Some of these disadvantages of systems having beamsplitter cubes may be avoided in the case of systems having one or more deflecting mirrors in their beam-deflecting device. However, such systems have the disadvantage that they are, by virtue of their design, necessarily off-axis systems.

A catadioptric reduction lens of that type is described in European Pat. No. EP-A-0 989 434, which corresponds to U.S. Ser. No. 09/364382. These types of lenses have a catadioptric first section having a concave mirror and a beam-deflection device that is followed by a dioptric second section arranged between their object plane and their image plane. Their beam-deflecting device, which is configured in the form of a reflecting prism, has a first reflective surface for deflecting radiation coming from their object plane to a concave mirror and a second reflective surface for deflecting radiation reflected by that concave mirror to a second section containing exclusively refractive elements. Their catadioptric first section creates a real intermediate image that lies slightly behind this prism's second reflective surface and well ahead of the first lens of their second section. Their intermediate image is thus readily accessible, which may be taken advantage of for, e.g., installing a field stop.

Another reduction lens that has a beam-deflection device having a deflecting mirror is described in U.S. Pat. No. 5,969,882, which corresponds to European Pat. No. EP-A-0 869 383. This system's deflecting mirror is arranged such that light coming from its object plane initially strikes the concave mirror of its first section, where it is reflected to the system's beam-deflecting device's deflecting mirror, where it is reflected to a second reflective surface, where it is deflected toward the lens of the system's exclusively dioptric second section. The elements of this system's first section that are utilized for creating its intermediate image are configured such that its intermediate image lies close to its beam-deflecting device's deflecting mirror. Its second section refocuses its intermediate image onto its image plane, which may be oriented parallel to its object plane, thanks to the reflecting surface that follows its intermediate image in the optical train.

U.S. Pat. No. 6,157,498 depicts a similar configuration whose intermediate image lies on, or near, the reflective surface of its beam-deflecting device. Several lenses of its second section are arranged between its beam-deflecting device and a deflecting mirror located in its second section. In addition, an aspheric surface is arranged in the immediate vicinity of, or near to, its intermediate image exclusively for the purpose of correcting for distortions, without affecting other imaging errors.

A projection lens having a reducing catadioptric section and an intermediate image in the vicinity of the deflecting mirror of a beam-deflection device is depicted in German Pat. No. DE 197 26 058.

The U.S. patent mentioned above, U.S. Pat. No. 5,999,333, depicts another catadioptric reduction lens having deflecting mirrors for which light coming from its object plane initially strikes a concave mirror, where it is reflected to the lens' beam-deflecting device's sole reflective surface. The intermediate image created by its catadioptric section lies close to this reflective surface, which reflects light coming from that concave mirror to a dioptric second section that images this intermediate image onto its image plane. Both its catadioptric section and its dioptric section create reduced images.

A similarly configured lens for which the intermediate image created by its catadioptric section lies near its deflecting device's sole reflective surface is depicted in Japanese Pat. No. JP-A-10010429. The surface of the lens of the following dioptric section that lies closest to the deflecting mirror is aspheric in order that it may make a particularly effective contribution to correcting for distortions.

Those systems whose intermediate image lies near, or on, a reflective surface may be compactly designed. They also allow keeping the field curvatures of these systems, which are off-axis illuminated, that will need to be corrected small. One of their disadvantages is that even the slightest flaws on any of their reflective surfaces may adversely affect the qualities of images projected onto their image plane. Moreover, their focusing of radiant energy onto reflective surfaces may cause heating effects that might adversely affect their imaging performance. The resultant, locally high, radiant intensities may also damage the reflective coatings that are normally applied to the surfaces of mirror blanks.

SUMMARY OF THE INVENTION

The problem addressed by the invention is avoiding the disadvantages of the state of the art. One particular object is to provide a projection lens whose imaging performance will be relatively insensitive to fabrication tolerances.

As a solution to these and other objects, the invention, according to one formulation, provides a catadioptric projection lens for imaging a pattern situated in an object plane of the projection lens onto an image plane of the projection lens while creating a real intermediate image, which includes:

a catadioptric first section with a concave mirror and a beam-deflecting device located between said object plane and the image plane; and a dioptric second section arranged following the beam-deflecting device;

wherein the second section starts after a final reflective surface of the catadioptric section and includes at least one lens arranged between the final reflective surface and the intermediate image.

Beneficial embodiments thereon are stated in the dependent claims. The wording appearing in all of the claims is herewith made a part of the contents of this description.

A projection lens in the sense of the invention that is of the type mentioned at the outset hereof is characterised in that its second, dioptric section, which starts behind the final reflective surface of its beam-deflecting device, has at least one lens arranged between said final reflective surface and its intermediate image. Said intermediate image thus lies within its second, exclusively refractive, section in order that at least one of the lenses of said second section that precede said intermediate image in the optical train may contribute to creating said intermediate image. The invention thus foresees that the distance between said final reflective surface of said beam-deflecting device and said intermediate image will be considerable, which may allow, e.g., creating an accessible intermediate image in order to, e.g., allow installing a field stop in order to reduce stray-light levels. It will be particularly beneficial if that large distance will provide that said final reflective surface lies in a zone where the beam diameter is rather large, which will provide for its uniform illumination while avoiding hazardous, localized, peaks in radiant intensity and spread any heating of the optical element to which said reflective surface has been applied over a larger area, which will, in turn, improve its imaging performance. More important, however, is that any minor flaws that may be present on its reflective surface will have only a negligible, or no, effect on the qualities of images projected onto the image plane. Lenses with high imaging performance may thus be constructed, in spite of the minimal demands on the uniformity and figure of said final reflective surface.

The term "final reflective surface," as used here, is to be interpreted as referring to that reflective surface that lies immediately ahead of said intermediate image in the optical train, where said surface may be a polarization-selective beamsplitting surface of a beamsplitter cube (BSC) or the surface of a highly reflective deflecting mirror, which may be preceded by another deflecting mirror of a beam-deflecting device in the optical train. Rear-surface mirrors in the form of deflecting prisms are also feasible. In the case of projection lenses according to the invention, said "final reflective surface" concludes their catadioptric section. Said final reflective surface may be followed by another reflective surface that causes a beneficial, from the structural standpoint, folding of said projection lens' optical path that has been added at the entrance to, or between the lenses of, said section in order to, e.g., allow orienting said projection lens' object and image planes parallel to one another.

Said optical element between said final reflective surface and said intermediate image that has been termed a "lens" here may also differ from conventional lenses in form and function and may be in the form of, e.g., a planar plate having an aspheric correction, a truncated lens, or a half-lens. The term "lens," as used here, thus, in general, refers to any transparent optical medium that optically affects transmitted radiation.

The aforementioned benefits apply regardless of whether a lens is arranged between said final reflective surface and said real intermediate image, largely due to the large distance between same. Said distance, which shall hereinafter also be referred to as the "intermediate-image distance," should preferably be chosen such that the diameter of the beam at a surface orthogonal to said optical axis at the intersection of said final reflective surface with said optical axis will be at least 10% of the diameter of said concave mirror, e.g., 17% or more of said diameter. However, said distance should not be so large that said ratio of the diameter of said beam to the diameter of said concave mirror will be much greater than 20% or 25% in order to confine the field curvatures that will need to be corrected to manageable levels. Said large intermediate-image distance will allow arranging said at least one lens between said final reflective surface and said real intermediate image, where said lens or lenses will preferably have a positive refractive power or powers, which will keep the diameter of those lenses that follow said intermediate image small, which, in turn, will allow designing said second section in manners that will allow reducing the quantities of materials required.

Arranging at least one lens between said final reflective surface and said real intermediate image also provides hitherto unknown opportunities for minimizing, or totally eliminating, the deleterious effects of lens heating. In order to reduce or preclude same, a preferred embodiment of the invention has a front intermediate-image lens arranged on its object side, ahead of said intermediate image, and a rear intermediate-image lens arranged on its image side, behind said intermediate image, where said intermediate-image lenses are symmetrically arranged with respect to said intermediate image such that any asymmetric contributions to imaging errors, such as coma, caused by heating of said intermediate-image lenses will be partially compensated, even nearly fully compensated, as shall be discussed in greater detail in terms of the sample embodiments to be discussed below.

The aforementioned symmetric arrangement of said front and rear intermediate-image lenses employed for partially or fully compensating for the effects of asymmetric heating of lenses situated in the vicinity of said intermediate image will be beneficial for both projection lenses of said type and other optical imaging systems that create at least one real intermediate image.

Obtaining the favorable arrangement of said intermediate image according to the invention will be simplified if said first, catadioptric section does not contribute, or does not materially contribute, to the overall reduction ratio of said projection lens. Said catadioptric first section of said projection lens should preferably have a magnifications, $\beta_M$, that exceed 0.95 and preferred embodiments of same will have magnifications of $\beta_M>1$, i.e., will create enlarged intermediate images, which will facilitate shifting same to said refractive second section.

In order to keep the field curvatures that will need to be corrected small in spite of said favorable arrangement of said intermediate image, it will be preferable to provide means for correcting for spherical aberration produced by said first section, which, in turn, will provide that the axial locations of its paraxial intermediate image and the intermediate image created by outlying marginal rays will be shifted such that they are closer proximity with respect to one another. It will be beneficial if the longitudinal spherical aberration, SAL, produced by said first section satisfies the condition 0<|SAL/L|<0.025, where L is the geometric distance between said object plane and the image plane of same, as shall be discussed in greater detail below.

Preferred embodiments of the invention will provide that that surface of that lens of said refractive section that lies closest to said intermediate image will be spherical. However, the surfaces of both lenses facing said intermediate image might also be spherical, which will allow fabricating lenses with high imaging performances and low scatter in their imaging performances without need for imposing extremely stringent tolerances on same, since the figuring accuracies attainable during fabrication are generally better for spherical surfaces than for aspherical surfaces, which also may exhibit transmittance gradients and excessive surface microroughnesses. On the other hand, those surfaces in the vicinity of intermediate images have extremely strongly impacts on corrections for imaging errors, such as distortion, which is why conventional lens designs frequently employ aspherical surfaces near intermediate images. However, in the case of those projection lenses considered here, it will be preferable to employ lenses with high-precision, nearly perfectly accurately figurable, spherical surfaces in the vicinity of said intermediate image.

The previous and other properties can be seen not only in the claims but also in the description and the drawings, wherein the individual characteristics may be used either alone or in sub-combinations as an embodiment of the invention and in other areas and may individually represent advantageous and patentable embodiments.

DETAILED DESCRIPTION OF THE PREFERRED EMBODIMENTS

In the following description of preferred embodiments of the invention, the term "optical axis" refers to a straight line or a sequence of straight-line segments passing through the centers of curvature of the optical elements involved, where said optical axis will be folded at the reflective surfaces of deflecting mirrors or other reflective optical elements. Directions and distances shall be designated as "image-side" directions or distances if they are directed toward either the image plane involved or a substrate to be illuminated that is present in said plane and as "object-side" directions or distances if they are directed along that segment of said optical axis extending toward the object involved. In the case of those examples presented here, said object may be either a mask (reticle) bearing the pattern of an integrated circuit or some other pattern, such as a grating. In the case of those examples presented here, the image of said object is projected onto a wafer coated with a layer of photoresist that serves as said substrate, although other types of substrate, such as components of liquid-crystal displays or substrates for optical gratings, may also be involved. In the following, identical or equivalent features of the various embodiments of the invention will be assigned the same reference numbers for greater clarity.

Figure 1:
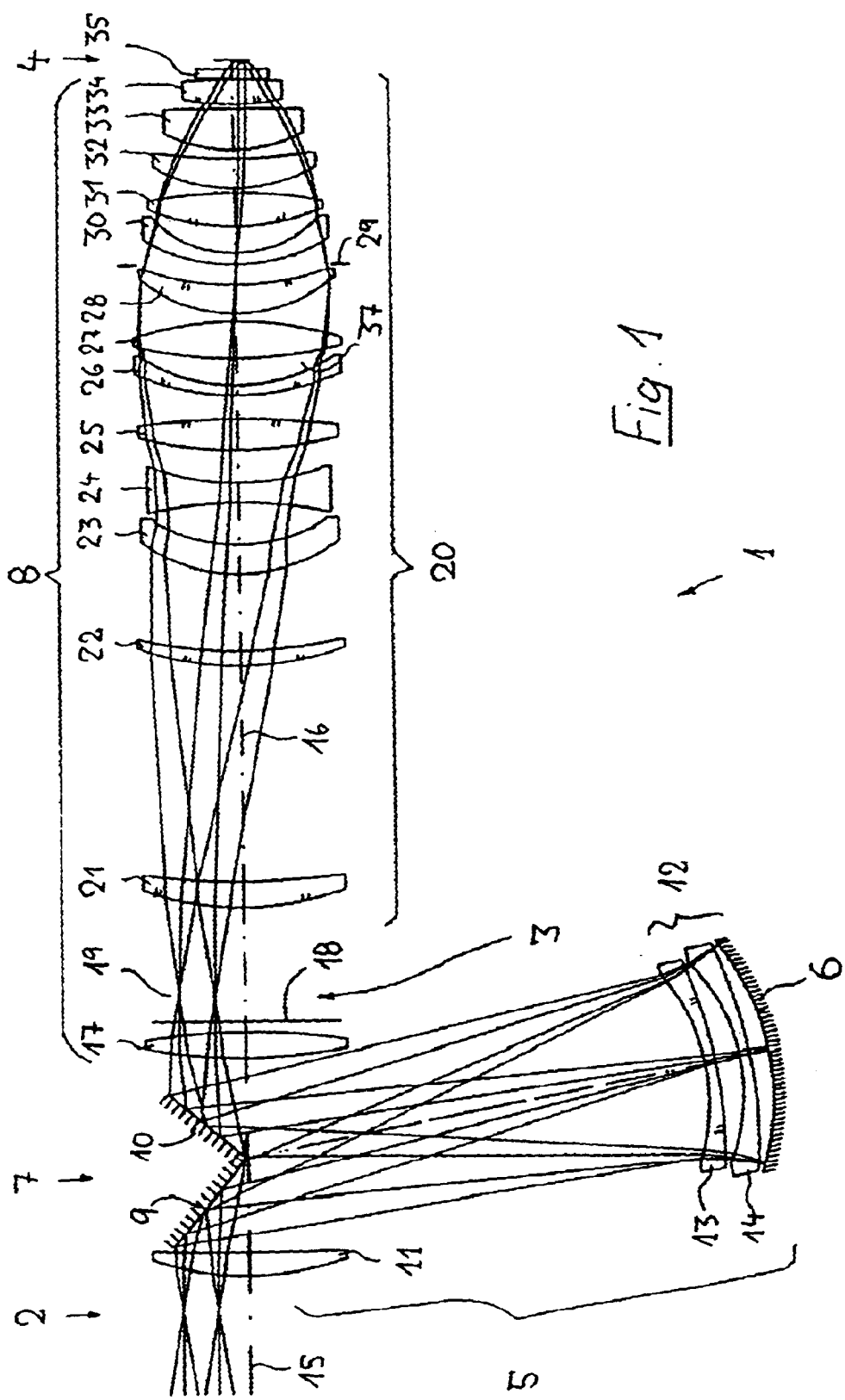
FIG. 1 is a longitudinal sectional drawing of a first embodiment of the invention.

A typical design for a catadioptric reduction lens 1 based on a first embodiment of same is depicted in FIG. 1 and serves to project a reduced image, e.g., an image whose linear dimensions have been reduced by a factor of ¼, of a pattern on a reticle or similar that is arranged in an object plane 2 onto an image plane 4 while creating a single, real, intermediate image 3. Said lens 1 has a catadioptric first section 5 containing a concave mirror 6 and a beam-deflecting device 7 arranged between its object plane 2 and image plane 3 and a dioptric second section 8 that contains exclusively refractive optical elements following said beam-deflecting device. Said beam-deflecting device 7 is configured in the form of a reflecting prism and has a first, planar, reflective surface 9 for deflecting radiation coming from said object plane 2 toward said concave mirror and a second, planar, reflective surface 10 for deflecting radiation reflected by said imaging concave mirror 6 toward said second section 8. Said reflective surface 10 represents both the final reflective surface of said catadioptric section 5 and the final reflective surface of said beam-deflecting device 7. Although said first reflective surface 9 for deflecting radiation to said concave mirror 6 is necessary, said second reflective surface 10 may be deleted, in which case, said object plane and said image plane would be roughly orthogonal to one another if no other deflecting mirrors were employed. As may be seen from FIG. 4, the optical train may also be folded within the bounds of said refractive section.

As may be seen from FIG. 1, light from an illumination system (not shown) enters a projection lens from that side of said object plane 2 opposite to said image plane and initially passes through a mask arranged in said object plane. Light transmitted by said mask then transits a collecting lens 11 with a convex entrance surface, where said collecting lens is arranged between said object plane 2 and said beam-deflecting device 7, and then is deflected toward a mirror group 12 that contains both said concave mirror 6 and a pair of negative lenses 13, 14 situated immediately in front of same, each of which has its surfaces curved towards the front surface of said concave mirror 6, by the folding mirror 9 of said beam-deflecting device 7, where said folding mirror 9 is inclined at an angle with respect to the optical axis 15 of the preceding section differing from 45° that has been chosen such that it deflects light incident on it through an angle greater than 90°, e.g., through 100°. Light reflected by said concave mirror 6 that has passed through said pair of negative lenses 13, 14 twice and been reflected back to said beam-deflecting device 7 will be reflected toward said dioptric second section 8 by the second folding mirror 10 of said beam-deflecting device 7. The optical axis 16 of said second section is parallel to the optical axis 15 of said entrance section and thus allows a mutually parallel orientation of said object plane 2 and said image plane 3, which will simplify the operation of a scanner.

A special characteristic of said second section 8 is that said second folding mirror 10 is followed at a distance by a first lens 17, which, in the case of the example shown, is in the form of a biconcave positive lens whose positive refractive power contributes to the creation of said real intermediate image 3. In the case of the embodiment depicted, said intermediate image will lie on the image side, following said first lens 17 and at a distance from same, whereby a paraxial intermediate image, which has been indicated by a pseudoplane 18, lying closer to the spherical exit surface of said first lens 17 than the intermediate image 19 created by outlying marginal rays.

A rear lens group 20 of said second section 8 that follows said intermediate image 3 images said intermediate image 3 onto said image plane 4. That lens 21 of said group 20 that lies closest to said intermediate image 3 is in the form of a positive meniscus lens whose curved surfaces are curved toward said object plane and whose distance from said intermediate image 3 exceeds the distance between said intermediate image and said first lens 17 of said second section 8. Said lens 21 is followed by another positive meniscus lens 22 whose curved surfaces are also curved toward said object plane and is arranged at a large distance from same that, in turn, is followed by a curved meniscus lens 23 whose curved surfaces are curved toward said object plane, a biconcave negative lens 24, and a biconvex positive lens 25 arranged at axial distances from same. Said lenses are followed by a negative meniscus lens 26 whose curved surfaces are curved toward said object plane and that has a slightly negative refractive power, which, in turn, is followed by a biconvex positive lens 27. A meniscus-shaped air space 37 whose curved surfaces are curved toward said object plane is situated between these latter lenses 26, 27. Another meniscus lens 28, which has a positive refractive power and whose curved surfaces are also curved toward said object plane, that follows said lenses in the optical train is immediately followed by a readily accessible system stop 29 arranged such that said air space 37 in the vicinity of said stop 29 lies ahead of same in the optical train. Said stop 29 is followed by a negative meniscus lens 30 whose concave surface faces said image plane that, in turn, is followed by a biconvex positive lens 31, a meniscus lens 32 that has a positive refractive power and whose curved surface is curved toward said object plane, a thick, biconvex positive lens 33, and another, small-diameter, biconvex, positive lens 34 that focus the transmitted beam and direct it toward a wafer arranged in said image plane 4. The optical element closest to said wafer is a plane-parallel end plate 35.

Table 1 summarizes the design specifications involved in tabular form, where the leftmost column thereof lists the number of the refractive, reflective, or otherwise designated surface, F, involved, the second column thereof lists the radius, r, of said surface [mm], the third column thereof lists the distance, d, between the surface involved and the next surface [mm], a parameter that is referred to therein as the "thickness", and the fourth column thereof lists the refractive index of the material employed for fabricating the optical element following the entrance face, a parameter that is referred to therein as its "index." The fifth column of said table is used for designating reflective surfaces, which are identified by the legend "REFL." The overall length, L, of the lens involved, measured from its object plane to its image plane, is about 1,250 mm.

In the case of this particular embodiment, eight of its surfaces are aspherical, namely the surface F7 and the surfaces F13, F20, F22, F29, F30, F36, F39, and F45.

In the figures, aspherical surfaces are hatched. Table 2 lists the associated data for these aspherical surfaces, from which they may be computed using the following equation:

$$p(h)=[((1/r)h^2)/(1+SQRT(1-(1+K)(1/r)^2h^2)]+C1\cdot h^4-C2\cdot h^6+\ldots,$$

where r is their local radius of curvature and h is the distance of a point on their surface from their optical axis. p(h) thus represents the radial displacement of said point from the inflection point of the surface in question along the z-direction, i.e., along their optical axis. The constants K, C1, C2, etc., are listed in Table 2.

The optical system 1 that may be reproduced using these data has been designed for use at a working wavelength of about 157 nm, at which the calcium fluoride employed for fabricating all of the lenses involved has a refractive index, n, of 1.55841. Its image-side numerical aperture, NA, is 0.80. Said system has been designed to have a field measuring 22 mm×7 mm and is doubly telecentric.

The operation of said optical system and several of its beneficial features will be described in greater detail below. The weakly positive first lens 11 of its catadioptric section 5 has a focal length that is roughly equal to the distance to same's concave mirror 6. Said concave mirror thus lies in the vicinity of a pupil of the system and may have a relatively small diameter, which will simplify its fabrication. The folding of the optical path at said section's first deflecting mirror 9 through an angle exceeding 90° is beneficial in that it provides a large working distance over the lens' full width. The pair of negative meniscus lenses 13, 14 immediately preceding said concave mirror 6 correct for longitudinal chromatic aberration, CHL. In the case of this particular embodiment, it will be beneficial if only two lenses 13, 14 are arranged within that portion of said catadioptric section 5 that is transited twice, since every lens situated within said portion has a double effect on, e.g., transmittance and the wavefront distortions, without providing any additional leeway for correcting for same.

A feature that is particularly noteworthy is that said catadioptric section 5, whose final optically effective surface is a deflecting mirror 10, either does not contribute to the system's overall reduction ratio or makes only a minor contribution thereto. Said catadioptric section has, in the embodiment shown here, a magnification, $\beta_M$, given by $|\beta_M|=0.99$, which makes a major contribution to the fact that the system's intermediate image 3 will be created at a great distance (the intermediate-image distance) down the optical train from said final deflecting mirror 10, which yields another benefit in that the radiant intensity incident on the second deflecting mirror 10 will be relatively uniformly distributed over a larger area than that represented by the state of the art, which, in turn, means that imaging errors due to nonuniform heating in the vicinity of said deflecting mirror 10 or the system's beam-deflecting device 7 will either be reduced or avoided altogether. Said intermediate-image distance has been chosen here such that the diameter of the beam incident on a surface normal to the optical axis 16 at the point where said second deflecting mirror 10 intersects said optical axis will range from about 17% to about 18% of the diameter of said main concave mirror 6.

Since said intermediate image will not lie on, or in the immediate vicinity of, said deflecting mirror 10, minor errors in fabricating the reflective surface of said deflecting mirror 10 may be readily tolerated, since they will either not be imaged onto the system's image plane 4 or will be defocused there and thus will have no adverse effects on images projected onto a wafer arranged on said image plane 4. Since said final reflecting surface 10 is subjected to relatively uniformly distributed radiant intensities only and minor errors in same are tolerable, it may be expected that the imaging performance of said projection lens 1 will remain unaffected by degradation of the (coated) surface of said mirror 10, even after many years of service in continuous operation.

The axial distance between said final reflecting surface 10 of said catadioptric section 5 and said intermediate image 3 that follows same in the optical train will, in the case of the embodiment depicted, as well as in all other embodiments of the invention, be so large that at least one lens of the dioptric section 8 that follows said catadioptric section in the optical train may be arranged between said final reflecting surface 10 and said intermediate image 3. In the case of the sample embodiment depicted, said lens is a biconvex lens 17 whose positive refractive power contributes to creation of said intermediate image 3. Incorporating sufficiently high refractive power into the region between said mirror 10 and said intermediate image will allow keeping the diameters of those lenses that follow said intermediate image 3 in the optical train small, which, in turn, will facilitate designing said dioptric section such that the quantities of materials required for its fabrication will be reduced. One opportunity for realizing said savings of materials will arise if said first lens 17 is fabricated in the form of a half-lens, which will be possible here, since only around half of its surface is optically utilized.

The invention allows optimizing catadioptric projection lenses having at least one intermediate image in relation to the adverse effects of asymmetric lens heating by adapting those lenses 17, 21 that surround their intermediate image to suit one another in an appropriate, special manner. Said first lens 17 located on their object side, ahead of said intermediate image 3, is also termed a "front intermediate-image lens," while said meniscus lens 21 that follows said intermediate image is also termed a "rear intermediate-image lens." Said intermediate-image lenses 17, 21 should be symmetrically arranged with respect to said intermediate image 3 such that contributions to imaging errors, such as coma, due to heating of said lenses will be partially compensated or largely fully compensated, where the first of said intermediate-image lenses 17 may, so to speak, provide a preliminary grip on thermally induced imaging errors that will be compensated by the second of said intermediate-image lenses 21 that follows it in the optical train, which will also be subject to heating. In the case of those off-axis systems that have been described here in terms of examples, those lenses situated in the vicinity of said intermediate image 3 will be extremely asymmetrically illuminated, which will lead to same being subjected to highly asymmetric heating effects. Said effects are largely responsible for uncorrectable distortions and coma occurring in images projected onto wafers. However, it should be noted at this juncture that imaging errors due to lens heating may limit imaging performance in the case of those catadioptric systems that have been described here in terms of examples.

If said lenses 17, 21 are symmetrically arranged about said intermediate image 3 in the manner described above, then it may be arranged that, e.g., the height ratios, i.e., the distances from the optical axis 16, of the upper and lower marginal rays of the field beams at said front and rear intermediate-image lenses 17, 21 will just barely reverse, which will allow using said rear intermediate-image lens 21 to partially or fully compensate for effects due to asymmetric heating of said front intermediate-image lens 17.

The symmetry mentioned above in relation to compensating for asymmetric lens-heating effects will not usually be equivalent to any geometric symmetries, e.g., symmetry with respect to reflection in the plane of said intermediate image 3, which will be clear from the layout of the embodiment depicted in FIG. 1, for which the distance between its intermediate image and the spherical exit surface of said front intermediate-image lens 17 is less than the distance between same and the aspherical entrance surface of said rear intermediate-image lens 21.

Among those lenses 17–35 situated within said second section 8, only those situated within its rearward lens group 20, i.e., all of said lenses, with the lone exception of lens 17, contribute to imaging said intermediate image onto the plane 4 of said wafer. Said lenses have been combined in a manner suitable for correcting for imaging errors in said intermediate image to the extent that a sufficient adequate correction status will be obtained at the plane 4 of said wafer. Among those lenses situated within said rearward lens group 20, lens 21 closest to the intermediate image plays a special role in same, since any imaging errors due to asymmetric heating of said lens will be at least partially compensated by said lens 17 situated ahead of said intermediate image, which provides a preliminary grip on thermally induced distortions, which will be eliminated upon transmission through said rear intermediate-image lens 21.

Figure 2:
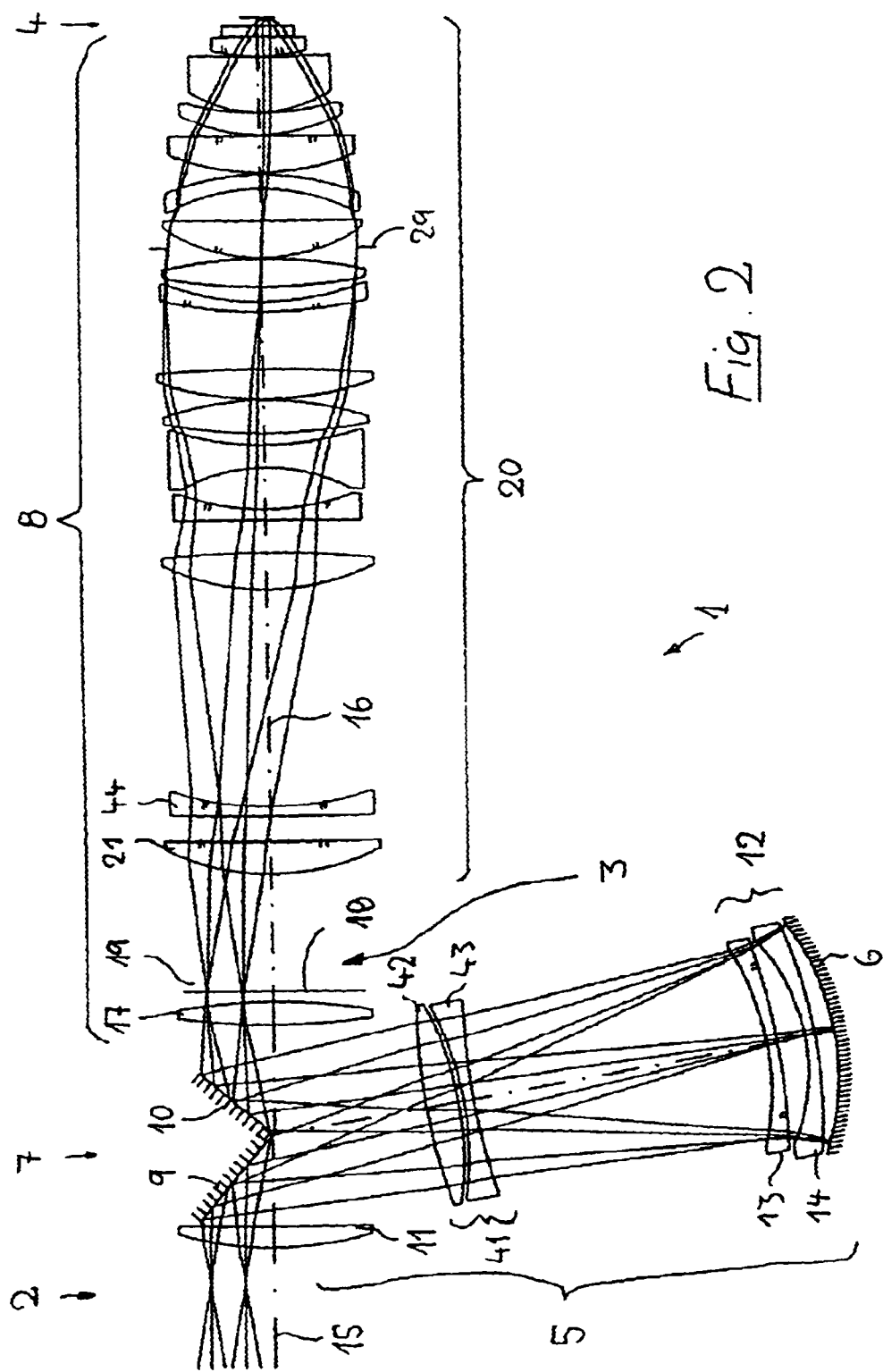
FIG. 2 is a longitudinal sectional drawing of a second embodiment of the invention.

FIG. 2 depicts a sectional view of another embodiment whose detailed specifications (data defining its aspherical surfaces) appear in Tables 3 and 4. This particular reduction lens 1, which has also been designed for a working wavelength of about 157 nm, has a basic layout similar to that of the embodiment depicted in FIG. 1 and also has a numerical aperture, NA, of 0.80. The reference numbers employed here are identical to those assigned to the corresponding lenses or lens groups appearing in FIG. 1. However, one major difference between this design and that of FIG. 1 is that an intermediate group 41 of lenses comprising a biconvex positive lens 42 facing its beamsplitter 7 and a biconcave negative lens 43 facing a mirror group 12, has been arranged within that portion of its optical train that is transited twice, roughly midway between said beamsplitter 7 and said mirror group 12. Increasing the refractive power of said intermediate lens group 41 may beneficially affect the diameter of said mirror group 12, which may then be reduced. In addition to said rear intermediate-image lens 21, a negative lens 44 has been arranged in the vicinity of its intermediate image.

Unlike the embodiment depicted in FIG. 1, both the exit surface of said front intermediate-image lens 17 facing said intermediate image 3 and the convex entrance surface of said rear intermediate-image lens 21 facing said object plane are spherical, which will allow highly accurately figuring both of these surfaces situated near said intermediate image, which, in turn, will allow minimizing imaging errors due to fabrication errors, such as surface irregularities or residual microroughness.

Figure 3:
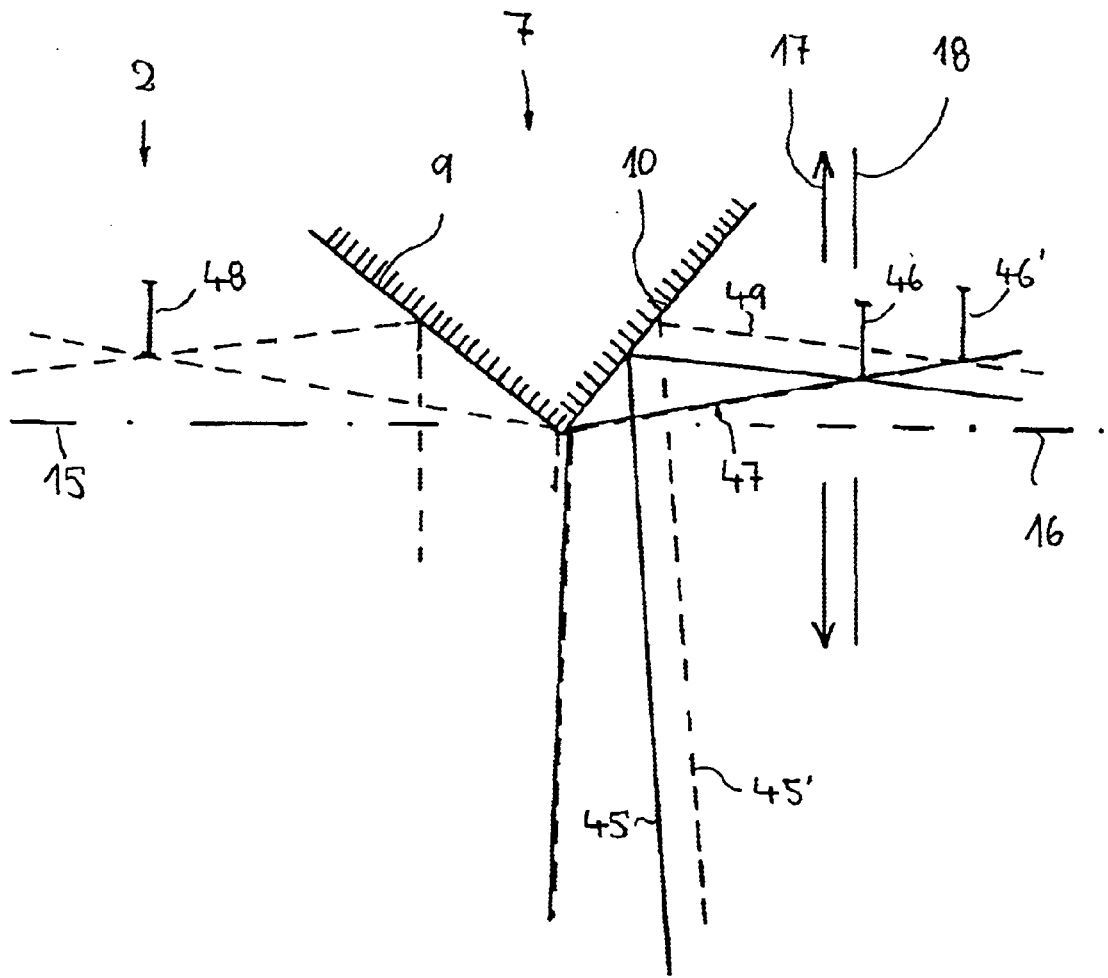
FIG. 3 is an enlarged view of the vicinity of the beam-deflection device depicted in FIG. 1.

In the case of embodiments according to the invention, minor longitudinal spherical aberration (SAL) at said intermediate image may be beneficial. In the case of the typical overall length, L, of about 1,250 mm involved here, SAL should not be more than about 30 mm, or at most 20 mm, in order that the ratio SAL/L will not be much greater than about 0.025. Under such conditions, the field curvatures that will need to be corrected may be kept small, in spite of the large intermediate-image distance involved, as will now be discussed in greater detail based on FIG. 3, which schematically depicts the vicinity of the beamsplitter prism 7 depicted in FIG. 1, where said front intermediate-image lens 17 has been schematically depicted only. The solid line designates a beam 45 close to the optical axis coming from a concave mirror, where, in the case of low SAL, said beam will create a marginal-ray intermediate image 46 in the plane 18 of the paraxial intermediate image. Said beam is routed such that that marginal ray 47 closest to said optical axis 16 will just barely fully strike the second surface 10 of said beamsplitter prism in order to provide imaging that will be free of vignetting. In the case of larger SAL, imaging that will be free of vignetting will only be attainable under otherwise identical conditions if the object field 48, and thus its associated intermediate image 46', shifts said beam further away from said optical axis 16, as indicated by the dotted line designating said shifted beam 45', whose marginal-ray intermediate image 46' will be formed behind said plane 18 of said paraxial intermediate image and at a certain distance from same. The location of said marginal ray 47 closest to said optical axis 16 will remain virtually unaltered compared to the case of said beam 45, while the location of that marginal ray 49 farthest away from said optical axis will have moved further away from same, provided that the beam divergence remains constant. It may be seen that the distance between said intermediate image 46 and said optical axis 16, i.e., the distance between the plane 18 of said paraxial intermediate image and said marginal-ray intermediate image 46, will be reduced in step with reductions in SAL. Similar will apply to the location of the object field, which is why low spherical aberrations help keep the field curvatures that will need to be corrected small.

Numerous variations on the invention, none of which have been illustrated here, are feasible. For example, said folding mirrors 9, 10 of said beam-deflecting device 7 may be replaced by separate folding mirrors having another orientation, if necessary. In the case of lenses with low numerical apertures and/or lenses with a side arm housing their main mirror 6 that is roughly normal to the structure housing the remainder of their optical elements, high-reflectance surfaces on the inner surfaces of, e.g., a deflecting prism, may be employed instead of mirrors with reflective coatings. Said beam-deflecting device 7 equipped with a pair of high-reflectance deflecting mirrors 9, 10 may also be replaced by a solid beamsplitter, such as a beamsplitter cube having a single beamsplitting surface that partially reflects and partially transmits incident radiation. Same might also be replaced by a partially transmitting mirror, although a polarization beamsplitter would be preferable. The reflective surface involved would represent the final reflective surface ahead of said intermediate image.

Figure 4:
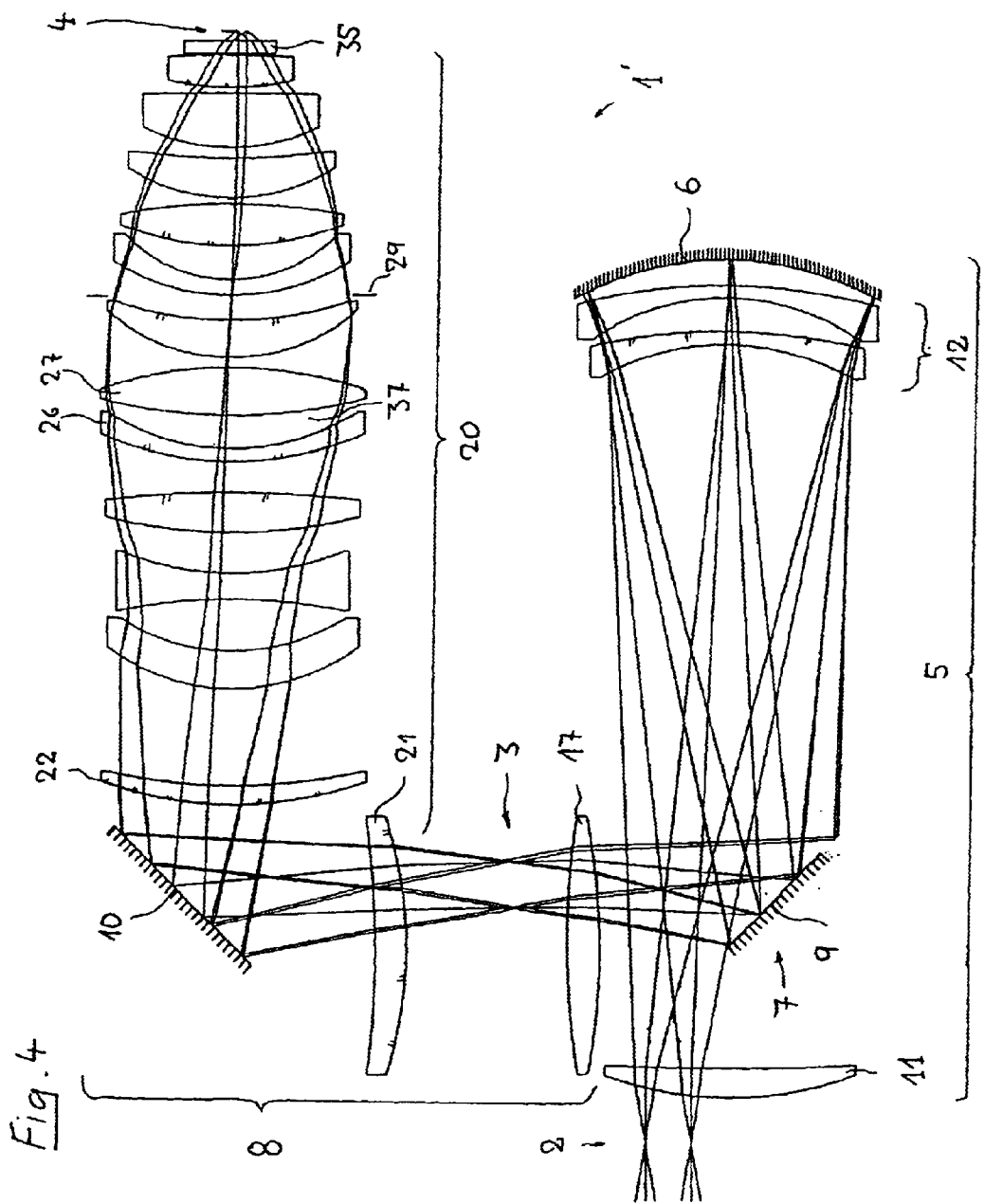
FIG. 4 is a longitudinal sectional drawing of another embodiment of the invention that has optical characteristics corresponding to those of the embodiment depicted in FIG. 1 and a folded second section.
Figure 5:
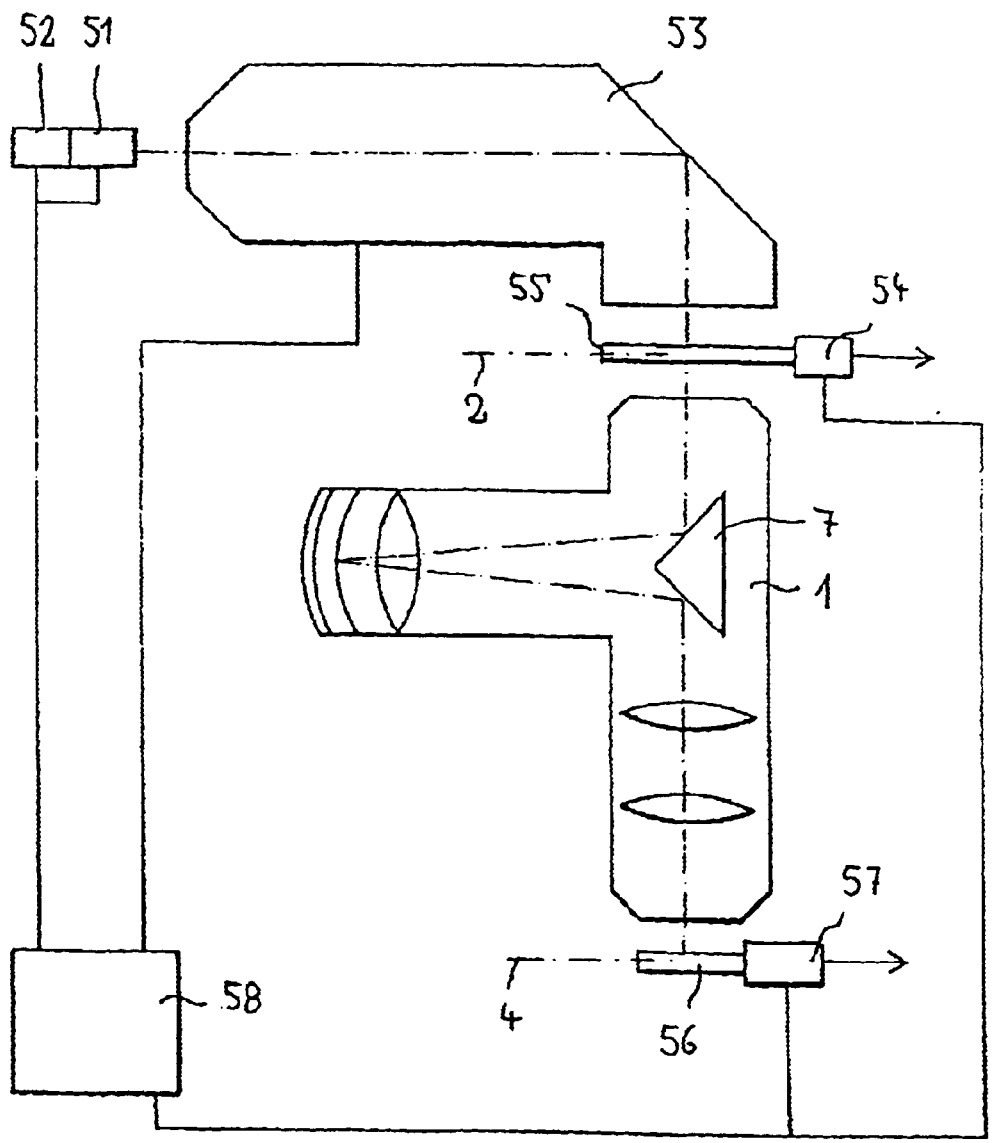
FIG. 5 is an embodiment of a microlithographic projection illumination system according to the invention.

Another opportunity for configuring a projection lens according to the invention is depicted in FIG. 4. Although the basic layout, i.e., the types of lenses involved, their numbers, their radii of curvature, the air spaces involved, etc., of the projection lens 1 depicted therein is identical to that of the embodiment depicted in FIG. 1 (cf. Tables 1 and 2), the beam-deflecting device 7, which is needed due to the type of layout involved, employed here has just a single, planar deflecting mirror 9. A second deflecting mirror 10 has been arranged between the relatively widely spaced lenses 21, 22 within its second, dioptric section 8, behind its intermediate image 3 in the optical train, in order to obtain a parallel orientation of the plane 2 of said reticle and the plane 4 of said wafer for this type of layout as well. Since said deflecting mirror 10 has been arranged behind said intermediate image 3, it does not form part of said beam-deflecting device 7, whose final reflective surface will now be said deflecting mirror 9. In the case of this type of design, light coming from said object plane 2 initially strikes an imaging concave mirror 6 that reflects it toward said sole deflecting mirror 9 of said beam-deflection device 7. The convergent beam incident on said final deflecting mirror 9 is deflected to said second, dioptric section 8, which is bent at a right angle due to its integral deflecting mirror 10. A lens 17 of said second section is arranged between said deflecting mirror 9 and said intermediate image 3, which is situated far from said deflecting mirror, exactly as in the case of the other embodiments. All of the benefits of the embodiment depicted in FIG. 1 are retained.

In the case of those embodiments described here, all of their transparent optical components are fabricated from the same material, namely, calcium fluoride. However, other materials, in particular, those crystalline fluoride materials mentioned at the outset hereof, that are transparent at the working wavelength to be involved may also be employed. At least one other material may also be employed in order to, e.g., correct for chromatic aberration, if necessary. The benefits of the invention may, of course, also be applied to systems intended for use at other working wavelengths, e.g., 248 nm or 193 nm, falling within the ultraviolet spectral region. Since, in the case of those embodiments depicted here, a single material is employed for fabricating all of their lenses, adapting the designs that have been illustrated to use at other wavelengths will be a simple matter for optical specialists. Other lens materials, such as synthetic quartz glass may be employed for fabricating some or all of their optical elements, particularly in the case of systems intended for use at longer wavelengths.

Projection lenses according to the invention may be employed on any suitable microlithographic projection illumination system, e.g., on wafer steppers or wafer scanners. FIG. 4 schematically depicts a wafer scanner 50 comprising a laser light source 51 equipped with an associated device 52 for narrowing its band width. An illumination system 53 generates a large, sharply defined, highly uniformly illuminated, image field that has been adapted to suit the telecentricity requirements of the projection lens 1 that follows it in the optical train. Said illumination system 53 is equipped with devices for selecting an illumination mode and may be switched between, e.g., conventional illumination with a high degree of coherence, annular illumination, and dipole or quadrupole illumination. Said illumination system is followed by a device 54 for holding and manipulating a mask 55 such that said mask 55 lies in said object plane 2 of said projection lens 1 and may be translated over said plane when said system is operated in scanner mode. In the case of the wafer scanner depicted here, said device 54 thus incorporates the scanner drive for said mask.

Said plane 2 of said mask is followed by said projection lens 1 that projects a reduced image of said mask onto a wafer 56 coated with a layer of photoresist that has been arranged in the image plane 4 of said projection lens 1. Said wafer 56 is held in place by a device 57 that includes a scanner drive in order to allow translating said wafer in synchronism with said mask. All of said systems are controlled by a controller 58. The designs of such systems are known and will thus not be discussed any further here.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

TABLE 1

| Surface No. | Radius | Thickness | Index | Reflective |
| --- | --- | --- | --- | --- |
| 0 | 0.0000 | 36.000 | 1 | |
| 1 | 0.0000 | 0.000 | 1 | |
| 2 | 303.9247 | 22.169 | 1.55841 | |
| 3 | 2732.7256 | 96.271 | 1 | |
| 4 | 0.0000 | 0.000 | −1 | REFL |
| 5 | 0.0000 | −468.173 | −1 | |
| 6 | 199.7080 | −10.268 | −1.55841 | |
| 7 | 485.9116 | −25.206 | −1 | |
| 8 | 186.8130 | −10.064 | −1.55841 | |
| 9 | 448.8758 | −19.609 | −1 | |
| 10 | 243.7460 | 19.609 | 1 | REFL |
| 11 | 448.8758 | 10.064 | 1.55841 | |
| 12 | 186.8130 | 25.206 | 1 | |
| 13 | 485.9116 | 10.268 | 1.55841 | |
| 14 | 199.7080 | 469.450 | 1 | |
| 15 | 0.0000 | 0.000 | −1 | REFL |
| 16 | 0.0000 | −100.166 | −1 | |
| 17 | −532.8260 | −25.379 | −1.55841 | |
| 18 | 635.9179 | −10.000 | −1 | |
| 19 | 0.0000 | −115.933 | −1 | |
| 20 | −311.6936 | −24.721 | −1.55841 | |
| 21 | −729.4902 | −219.394 | −1 | |
| 22 | −276.2460 | −15.427 | −1.55841 | |
| 23 | −448.8506 | −75.934 | −1 | |
| 24 | −158.3810 | −30.587 | −1.55841 | |
| 25 | −163.4782 | −40.576 | −1 | |
| 26 | 419.7809 | −20.540 | −1.55841 | |
| 27 | −237.0092 | −32.234 | −1 | |
| 28 | −428.0516 | −30.182 | −1.55841 | |
| 29 | 693.3900 | −23.874 | −1 | |
| 30 | −241.2068 | −10.000 | −1.55841 | |
| 31 | −182.4638 | −25.712 | −1 | |
| 32 | −422.9386 | −36.706 | −1.55841 | |
| 33 | 327.0334 | −7.823 | −1 | |
| 34 | −150.5655 | −28.311 | −1.55841 | |
| 35 | −314.2186 | −15.947 | −1 | |
| 36 | 0.0000 | −3.484 | −1 | |
| 37 | −172.8501 | −12.272 | −1.55841 | |
| 38 | −116.0764 | −25.993 | −1 | |
| 39 | −230.6308 | −32.436 | −1.55841 | |
| 40 | 465.5346 | −4.280 | −1 | |
| 41 | −153.0332 | −30.802 | −1.55841 | |
| 42 | −514.5406 | −8.487 | −1 | |
| 43 | −157.6109 | −41.061 | −1.55841 | |
| 44 | 2904.8207 | −4.477 | −1 | |
| 45 | −226.8988 | −24.123 | −1.55841 | |
| 46 | 847.7062 | −0.972 | −1 | |
| 47 | 0.0000 | −10.000 | −1.55841 | |
| 48 | 0.0000 | −8.006 | −1 | |
| 49 | 0.0000 | 0.000 | −1 | |

TABLE 2

| Surface No. | K | C1 | C2 | C3 | C4 | C5 | C6 |
|---|---|---|---|---|---|---|---|
| 7 | 0 | 3.8786E−09 | −1.5770E−13 | 1.6270E−17 | −1.1233E−21 | −1.5136E−26 | 8.5713E−31 |
| 13 | 0 | 3.8786E−09 | −1.5770E−13 | 1.6270E−17 | −1.1233E−21 | −1.5136E−26 | 8.5713E−31 |
| 20 | 0 | 3.6292E−09 | 6.7560E−14 | 5.6841E−19 | −6.7883E−23 | 6.7834E−27 | −2.0530E−31 |
| 22 | 0 | 1.1976E−08 | 7.3544E−14 | 7.0329E−19 | −1.2632E−23 | −3.0105E−27 | 2.0874E−31 |
| 29 | 0 | −8.3929E−09 | −3.3961E−13 | 8.7632E−18 | −1.4358E−21 | 5.5923E−26 | 2.0181E−30 |
| 30 | 0 | 1.7409E−08 | −1.6961E−13 | 1.1828E−17 | −3.0819E−21 | 1.7008E−25 | −1.6848E−30 |
| 35 | 0 | −2.1445E−08 | 6.7395E−13 | −4.8468E−17 | 5.9926E−21 | −2.8763E−25 | 3.9059E−31 |
| 39 | 0 | 1.6042E−08 | 4.7884E−15 | 2.0832E−16 | −2.8771E−20 | 1.7749E−24 | −1.9350E−29 |
| 45 | 0 | −6.5639E−08 | −8.2521E−12 | −1.2733E−16 | −1.1662E−20 | −1.5813E−23 | 6.3953E−27 |

TABLE 3

| Surface No. | Radius | Thickness | Index | Reflective |
|---|---|---|---|---|
| 0 | 0.0000 | 36.0000 | 1.000000 | |
| 1 | 0.0000 | 0.0000 | 1.000000 | |
| 2 | 333.2125 | 20.7650 | 1.558410 | |
| 3 | 3917.6389 | 94.1110 | 1.000000 | |
| 4 | 0.0000 | 0.0000 | −1.000000 | REFL |
| 5 | 0.0000 | −148.1340 | −1.000000 | |
| 6 | −595.2534 | −32.1340 | −1.558410 | |
| 7 | 331.1147 | −5.4880 | −1.000000 | |
| 8 | 312.7988 | −10.0000 | −1.558410 | |
| 9 | −682.8537 | −300.0000 | −1.000000 | |
| 10 | 264.3436 | −10.2440 | −1.558410 | |
| 11 | 731.0776 | −28.2930 | −1.000000 | |
| 12 | 191.6338 | −10.0480 | −1.558410 | |
| 13 | 479.5908 | −19.2310 | −1.000000 | |
| 14 | 254.9692 | 19.2310 | 1.000000 | REFL |
| 15 | 479.5908 | 10.0480 | 1.558410 | |
| 16 | 191.6338 | 28.2930 | 1.000000 | |
| 17 | 731.0776 | 10.2440 | 1.558410 | |
| 18 | 264.3436 | 300.0000 | 1.000000 | |
| 19 | −682.8537 | 10.0000 | 1.558410 | |
| 20 | 312.7988 | 5.4880 | 1.000000 | |
| 21 | 331.1147 | 32.1340 | 1.558410 | |
| 22 | −595.2534 | 146.3160 | 1.000000 | |
| 23 | 0.0000 | 0.0000 | −1.000000 | REFL |
| 24 | 0.0000 | −112.8570 | −1.000000 | |
| 25 | −660.9668 | −23.0610 | −1.558410 | |
| 26 | 556.1870 | −10.0000 | −1.000000 | |
| 27 | 0.0000 | −116.4030 | −1.000000 | |
| 28 | −226.5082 | −31.7500 | −1.558410 | |
| 29 | −3414.2334 | −25.1180 | −1.000000 | |
| 30 | −3354.8183 | −10.0000 | −1.558410 | |
| 31 | −314.6991 | −217.5910 | −1.000000 | |
| 32 | −233.5958 | −36.8330 | −1.558410 | |
| 33 | 960.2043 | −32.3470 | −1.000000 | |
| 34 | 5805.6084 | −10.0020 | −1.558410 | |

TABLE 3-continued

| Surface No. | Radius | Thickness | Index | Reflective |
|---|---|---|---|---|
| 35 | −240.7709 | −42.3390 | −1.000000 | |
| 36 | 169.2097 | −20.9060 | −1.558410 | |
| 37 | −286.7201 | −11.5480 | −1.000000 | |
| 38 | −478.5727 | −34.5630 | −1.558410 | |
| 39 | 301.8036 | −1.0000 | −1.000000 | |
| 40 | −355.1135 | −27.7490 | −1.558410 | |
| 41 | 1378.0763 | −56.2110 | −1.000000 | |
| 42 | −415.3177 | −10.0000 | −1.558410 | |
| 43 | −256.9507 | −15.2090 | −1.000000 | |
| 44 | −559.7690 | −26.8590 | −1.558410 | |
| 45 | 479.6752 | −10.5050 | −1.000000 | |
| 46 | 0.0000 | 9.4930 | −1.000000 | |
| 47 | −174.1879 | −35.5680 | −1.558410 | |
| 48 | −7171.0639 | −32.6510 | −1.000000 | |
| 49 | 183.6755 | −13.5520 | −1.558410 | |
| 50 | 255.5654 | −2.3140 | −1.000000 | |
| 51 | −242.4305 | −34.8290 | −1.558410 | |
| 52 | 9821.8721 | −1.4240 | −1.000000 | |
| 53 | −157.8195 | −22.5240 | −1.558410 | |
| 54 | −257.8030 | −1.1080 | −1.000000 | |
| 55 | −125.4426 | −52.2320 | −1.558410 | |
| 56 | −545.5697 | −1.2640 | −1.000000 | |
| 57 | −182.4345 | −19.6850 | −1.558410 | |
| 58 | 3491.0716 | −1.1000 | −1.000000 | |
| 59 | 0.0000 | −10.0000 | −1.558410 | |
| 60 | 0.0000 | −8.0420 | −1.000000 | |
| 61 | 0.0000 | 0.0000 | −1.000000 | |

TABLE 4

| Surface No. | K | C1 | C2 | C3 | C4 | C5 | C6 |
|---|---|---|---|---|---|---|---|
| 11 | 0 | 6.1332E−09 | −6.4063E−14 | −4.5499E−18 | −2.3621E−22 | 2.4653E−26 | −3.8399E−30 |
| 17 | 0 | 6.1332E−09 | −6.4063E−14 | −4.5499E−18 | −2.3621E−22 | 2.4653E−26 | −3.8399E−30 |
| 29 | 0 | 3.5716E−09 | −2.9481E−13 | 5.3916E−18 | 4.4070E−23 | 5.4581E−27 | −7.3136E−31 |
| 31 | 0 | −1.8810E−08 | 2.0385E−13 | −1.4483E−18 | −5.4964E−22 | 1.5447E−26 | 1.0845E−30 |
| 35 | 0 | −1.6228E−08 | −2.1449E−13 | −2.4296E−17 | 4.2715E−21 | −5.4242E−25 | 3.1678E−29 |
| 42 | 0 | 1.7399E−08 | −7.3701E−13 | −3.4088E−17 | 1.1643E−21 | −4.5566E−26 | 1.2003E−30 |
| 47 | 0 | 3.9491E−09 | −5.1757E−14 | −4.2800E−18 | 6.4019E−22 | −1.0309E−25 | −7.9826E−30 |
| 52 | 0 | −1.7053E−08 | 8.0221E−13 | −8.4651E−17 | 7.3497E−21 | −5.0447E−25 | 9.0347E−30 |
| 57 | 0 | 1.3027E−07 | 4.8555E−12 | −2.2801E−15 | 3.5482E−19 | −5.9522E−23 | 1.5762E−26 |

What is claimed is:

1. A catadioptric projection lens for imaging a pattern situated in an object plane of the projection lens onto an image plane of the projection lens while creating a real intermediate image, comprising:
- a catadioptric first section with a concave mirror and a beam-deflecting device located between said object plane and said image plane; and
- a dioptric second section arranged following said beam-deflecting device;
- said second section starting after a final reflective surface of said catadioptric section and comprising at least one lens arranged between said final reflective surface and said intermediate image; and
- said beam-deflecting device being a geometric beam splitter having at least one planar reflective surface.

2. A projection lens according to claim 1, wherein said intermediate image is situated in an empty space at a distance from an optical component nearest said intermediate image.

3. A projection lens according to claim 1, wherein said intermediate image is freely accessible.

4. A projection lens according to claim 1, wherein said intermediate image is situated at a distance from a final reflective surface of said beam-deflecting device, where said distance is chosen such that the diameter of rays incident on a surface orthogonal to the optical axis at an intersection of said final reflective surface with said optical axis is at least 10% of the diameter of said concave mirror.

5. A projection lens according to claim 1, wherein positive refractive power is arranged between said final reflective surface and said intermediate image.

6. A projection lens according to claim 1, wherein a front lens is inserted on the object side ahead of said intermediate image and a rear lens is inserted on the image side following said intermediate image and wherein the front lens and the rear lens are roughly symmetrically arranged with respect to said intermediate image such that asymmetric contributions to imaging aberrations by the front lens and the rear lens due to heating of the front lens and the rear lens are at least partly compensated.

7. A projection lens according to claim 1, wherein there is provided at least one lens of said second section having a surface facing said intermediate image, the surface being spherical.

8. A projection lens according to claim 6, wherein surfaces of the front lens and the rear lens facing said intermediate image are spherical.

9. A projection lens according to claim 1, wherein said catadioptric first section has a magnification $\beta_M$ greater than 0.95.

10. A projection lens according to according to claim 1, wherein said catadioptric first section is corrected for spherical aberration such that the longitudinal spherical aberration, SAL, of said catadioptric first section satisfies the following condition:

0<|SAL/L|<0.025, where L is the geometric distance between said object plane and said image plane.

11. A projection lens according to claim 1, wherein an intermediate-lens group with at least one lens is arranged in said catadioptric first section between the beam-deflecting device and a mirror group, the mirror group including said concave mirror and at least one negative lens.

12. A projection lens according to claim 11, wherein said intermediate-lens group includes at least one positive lens.

13. A projection lens according to claim 1, wherein said beam-deflecting device has a first mirrored surface for deflecting radiation coming from said object plane to said concave mirror and a second mirrored surface, inclined at an angle with respect to said first mirrored surface, for deflecting radiation coming from said concave mirror to said second section.

14. A projection lens according to claim 1, wherein said beam-deflecting device has only a single mirrored surface arranged such that it reflects radiation coming from the concave mirror to said second section.

15. A projection lens according to claim 1, wherein a polarization-selective mirrored surface is arranged inside a beamsplitter cube.

16. A projection lens according to claim 1, wherein a lens with a positive refractive power is arranged between said object plane and said beam-deflecting device.

17. A projection lens according to claim 1, wherein a system stop is provided and wherein a curved, meniscus-shaped, air space is situated ahead of the system stop and close to the same.

18. A projection lens according to claim 1, wherein at least the image side is telecentrically designed.

19. A projection lens according claim 1, wherein it is designed for use with ultraviolet light falling within the wavelength range extending from 120 nm to approximately 260 nm.

20. A projection illumination system for use in microlithography including an illumination system and a catadioptric projection lens for imaging a pattern situated in an object plane of the projection lens onto an image plane of the projection lens while creating a real intermediate image, the catadioptric projection lens comprising:
- a catadioptric first section with a concave mirror and a beam-deflecting device located between said object plane and said image plane; and
- a dioptric second section arranged following said beam-deflecting device;
- wherein said second section is located after a final reflective surface of said catadioptric section and comprises at least one lens arranged between said final reflective surface and said intermediate image; and
- wherein said beam-deflecting device is a geometric beam splitter having at least one planar reflective surface.

21. A method for fabricating semiconductor devices, or other types of microdevices, comprising:
- providing a mask having a prescribed pattern,
- illuminating said mask with ultraviolet light having a prescribed wavelength, and
- projecting an image of said pattern onto a photosensitive substrate situated in the vicinity of the image plane of a projection lens using a catadioptric projection lens having a catadioptric projection lens for imaging a pattern situated in an object plane of the projection lens onto an image plane of the projection lens while creating a real intermediate image, the projection lens including:
  - a catadioptric first section with a concave mirror and a beam-deflecting device located between said object plane and said image plane; and
  - a dioptric second section arranged following said beam-deflecting device;
  - said second section starting after a final reflective surface of said catadioptric section and having at least one lens arranged between said final reflective surface and said intermediate image; and
  - said beam-deflecting device being a geometric beam splitter having at least one planar reflective surface.

22. A projection lens according to claim 1, wherein said catadioptric first section has a magnification $\beta_M$ greater than unity.

23. A catadioptric projection lens for imaging a pattern situated in an object plane of the projection lens onto an image plane of the projection lens while creating a real intermediate image, comprising:

a catadioptric first section with a concave mirror and a beam-deflecting device located between said object plane and said image plane; and a dioptric second section arranged following said beam-deflecting device;

said second section starting after a final reflective surface of said catadioptric section and comprising at least one lens arranged between said final reflective surface and said intermediate image; and said beam-deflecting device having a first reflective surface for deflecting radiation coming from said object plane to said concave mirror and a second reflective surface, inclined at an angle with respect to said first reflective surface, for deflecting radiation coming from said concave mirror to said second section.

24. A catadioptric projection lens for imaging a pattern situated in an object plane of the projection lens onto an image plane of the projection lens while creating a real intermediate image, comprising:

a catadioptric first section with a concave mirror and a beam-deflecting device located between said object plane and said image plane; and a dioptric second section arranged following said beam-deflecting device;

said second section starting after a final reflective surface of said catadioptric section and comprising at least one lens arranged between said final reflective surface and said intermediate image; and said beam-deflecting device having only a single planar reflective surface arranged such that it reflects radiation coming from the concave mirror to said second section.

* * * * *